ELECTRONIC MULTIVIBRATOR CIRCUIT USING NEGATIVE-RESISTANCE ELEMENTS

Filed Jan. 9, 1961

INVENTOR
Henry de REYNOLD

United States Patent Office 3,222,540
Patented Dec. 7, 1965

3,222,540

ELECTRONIC MULTIVIBRATOR CIRCUIT USING NEGATIVE-RESISTANCE ELEMENTS

Henry de Reynold, Neuchatel, Switzerland, assignor to Ebauches S.A., Neuchatel, Switzerland, a firm of Switzerland Filed Jan. 9, 1961, Ser. No. 81,554
Claims priority, application Switzerland, Jan. 19, 1960, 557/60
9 Claims. (Cl. 307—88.5)

This invention relates to an electronic bistable multivibrator circuit which has two negative-resistance multivibrator elements, and more particularly the circuit is characterised in that it includes a capacitor connected in series with the first element which serves to supply the second element in such manner that the two multivibrator elements remain non-conductive between any two successive pulses of the multivibrator.

It is known that in conventional electronic multivibrators each of the two multivibrator elements remains conductive until the other becomes in turn conductive, and vice-versa. According to the invention, however, the two multivibrator elements are non-conductive between each impulse of the circuit. This results in a considerable saving in the supply energy, an increase in the length of life of the multivibrator elements and the possibility of producing short-duration pulses independently of the repetition rate of these pulses.

Briefly, the invention contemplates an electronic bistable circuit which includes two negative resistance elements which are connected in series. An energy storing device is connected in the circuit so as to be common to both negative resistance elements. The arrangement is such that upon receipt of a first pulse of a given polarity the first of the negative resistance elements charges the energy storing device while the other element remains nonconductive and, upon receipt of a second pulse of the same polarity by both elements a blocking voltage is applied to the first negative resistance element by the energy storage device and the second negative resistance element discharges the energy storage device.

The drawing given by way of example illustrates various embodiments of the invention.

Figures 1, 2, 3, 4, 5:
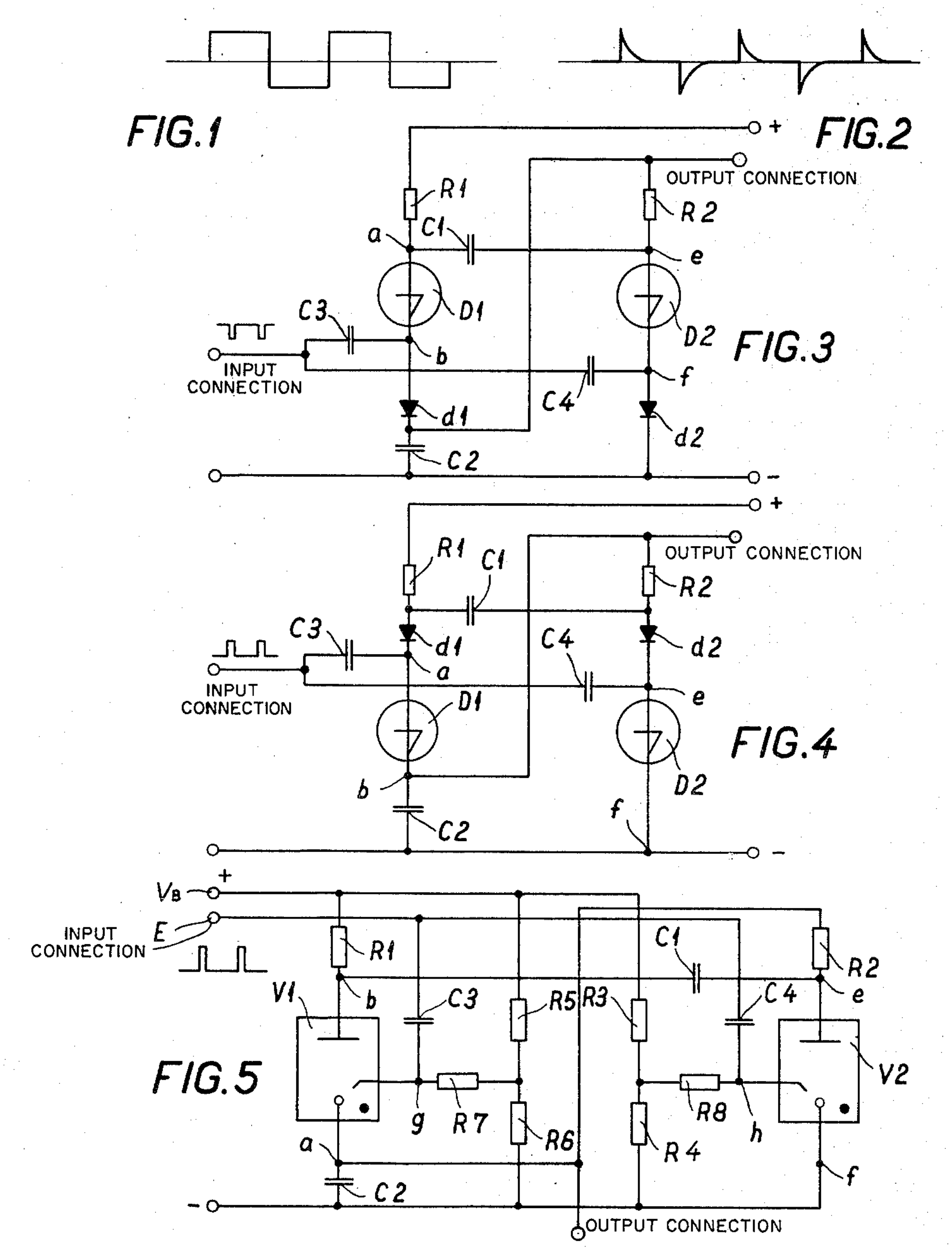
FIG. 1 is a waveform diagram showing pulse voltages with respect to time in a conventional electronic multivibrator circuit.
FIG. 2 is a waveform diagram showing the impulse voltages with respect to time in the electronic multivibrator circuit according to the invention.
FIG. 3 is an electronic circuit diagram of a first embodiment of the invention.
FIG. 4 is an electronic circuit diagram showing a modification of the circuit diagram shown in FIG. 3.
FIG. 5 shows the electronic circuit diagram of another embodiment of the invention.

The rectangular voltage pulses in FIG. 1 are associated with the operation of a conventional multivibrator circuit in which the multivibrator elements (semi-conductive diodes, gas-filled tubes, etc.) are constantly conductive since the pulse voltage passes instantaneously from a positive value to a negative value.

In the diagram shown in FIG. 2, on the other hand the steep-front voltage pulses are separated from one another by an interval of time during which neither of the two elements of the multivibrator circuit conducts. The interval thus corresponds to a zero energy output of the said multivibrator circuit.

The circuit diagram shown in FIG. 3 is for an electronic multivibrator circuit which delivers output pulses similar to those shown in FIG. 2. The circuit comprises essentially two diodes $D_1$ and $D_2$ each having four semi-conductive layers of the N-P-N-P type. The diodes $D_1$ and $D_2$ are connected in series by means of a rectifier $d_1$ and a resistance $R_2$, while a capacitor $C_2$ connects the junction of rectifier $d_1$ and resistor $R_2$ to ground. The references *a*, *b* on the one hand and *e*, *f* on the other hand respectively denote the pairs of terminals of the diodes $D_1$ and $D_2$. The terminals *b* and *f* are driven, according to FIG. 3, by negative pulses fed via capacitors $C_3$ and $C_4$ respectively connected in parallel to the terminals *b* and *f*. The terminals *a* and *e* and connected together by a blocking capacitor $C_1$.

The multivibrator circuit shown in FIG. 3 operates in the following way:

The first negative pulse simultaneously drives the diodes $D_1$ and $D_2$ by means of the capacitors $C_3$ and $C_4$. The potential difference between terminals *a* and *b* resulting in the increased supply voltage from the pulse voltage is then sufficient to cause diode $D_1$ to conduct and enable the capacitor $C_2$ to be charged via the rectifier $d_1$. The charge on capacitor $C_2$, however, entails a drop in the potential difference between terminals *a* and *b* which difference, when it passes below the operating threshold of the diode $D_1$, renders the latter non-conductive. Furthermore, the charge of the capacitor $C_2$ is insufficient for the latter alone to cause the diode $D_2$ to conduct so that neither of the two diodes $D_1$ and $D_2$ conducts at this stage of operation.

The second negative pulse in turn simultaneously drives the diodes $D_1$ and $D_2$ but this time the potential difference between the terminals *e* and *f* (voltage of the capacitor $C_2$ increased from that of the second pulse) is sufficient for the operational threshold of the diode $D_2$ to be exceeded and for it to conduct. The capacitor $C_2$ then discharges to earth through $D_2$ and through a rectifier $d_2$; the voltage between terminals *e* and *f* drops below the operating threshold of the diode $D_2$ and the latter is again non-conductive. The multivibrator circuit has therefore returned to its initial state and the third negative pulse will act on the circuit in the same way as the first pulse. The time during which the multivibrator circuit gives an output, that is to say the duration of each pulse, depends on the time constant of the circuit containing the capacitor $C_2$. The blocking capacitor $C_1$ connecting the corresponding terminals *a* and *e* is intended to ensure successive operation of the diodes $D_1$ and $D_2$ and hence prevent any simultaneous accidental operation of the said diodes. The output may be taken from the junction of diode $d_1$ and capacitor $C_2$.

The embodiment shown in FIG. 4 differs from that shown in FIG. 3 only in that the multivibrator circuit is driven by means of positive pulses. It follows that the rectifiers $d_1$ and $d_2$ are respectively connected in the terminals *a* and *e* instead of terminals *b* and *f* as in FIG. 3. Similarly the capacitors $C_3$ and $C_4$ are respectively connected to terminals *a* and *e*.

According to the embodiment shown in FIG. 5, the multivibrator circuit elements comprise two gas-filled cold-cathode diodes tubes $V_1$ and $V_2$ each provided with striking electrodes at *g* and *h* respectively; these tubes $V_1$ and $V_2$, like the diodes $D_1$ and $D_2$ in FIGS. 3 and 4, are connected in series. The driving pulses (positive in FIG. 5) introduced at input E are simultaneously fed to the striking electrodes of tubes $V_1$ and $V_2$ via capacitors $C_3$ and $C_4$. Two voltage dividers constituted by pairs of resistances $R_3$ and $R_4$ on the one hand and $R_5$ and $R_6$ on the other hand establish the operating bias of the striking electrodes of the tubes $V_1$ and $V_2$. Resistors $R_7$ and $R_8$ are intended to limit the striking voltages and isolate the capacitors $C_3$ and $C_4$ from the voltage dividers. When operating voltage $V_B$ is present, only the tube $V_1$ is supplied therefrom, the subsequent supplying of the tube $V_2$ result solely from the charge of the capacitor $C_2$. The two tubes $V_1$, $V_2$ are non-conductive before the first pulse.

The first pulse simultaneously drives tubes $V_1$ and $V_2$ by means of the capacitors $C_3$ and $C_4$; the tube $V_1$ which is alone receiving anode voltage fires as a result of the pulse and becomes conductive; the capacitor $C_2$ charges and produces a negative pulse transmitted from the anode of tube $V_1$ to the anode of tube $V_2$ by means of the blocking capacitor $C_1$, which has the effect of preventing simultaneous firing of tubes $V_1$ and $V_2$. The capacitor $C_2$ being charged, the potential difference between terminals *a* and *b* of tube $V_1$ drops below the operating threshold of tube $V_1$, so that the tube $V_1$ ceases to be conductive. At this stage of operation, neither of the tubes $V_1$, $V_2$ conducts.

The second pulse simultaneously drives the striking electrodes of tubes $V_1$ and $V_2$ also, but only tube $V_2$ strikes and, becoming conductive, discharges the condenser $C_2$. Tubes $V_1$ and $V_2$ then no longer conduct until the third pulse arrives, which acts like the first.

What I claim is:

1. An electronic bistable circuit, comprising in combination, an input terminal and at least one output terminal, a first series circuit including a first negative resistance element, a first diode, a capacitor and a first resistor, a second series circuit including a second negative resistance element, a second diode, and a second resistor, said second series connection being connected shunting said first capacitor, a direct voltage source connected to ends of said first series connection and having a polarity corresponding to the forward direction of said first and second diodes and a voltage lower than the threshold voltage of said first and second negative resistance elements, first and second coupling capacitors coupling said input terminal to said first and second series circuits and adapted to transmit input pulses to said first and second negative resistance elements respectively, said output terminal being coupled to one of said first and second series circuits.

2. An electronic bistable circuit as claimed in claim 1, including a third coupling capacitor coupling said first series circuit to said second series circuit for reducing the potential across one of said first and second negative resistance elements when a current pulse rises in the other of said negative resistance elements.

3. An electronic bistable circuit as claimed in claim 2, wherein said third coupling capacitor is connected between two corresponding points of said first and second series circuits.

4. An electronic bistable circuit as claimed in claim 2, wherein said first series circuit includes a first junction between said first resistor and said first negative resistance element, a second junction between said first negative resistance element and said first diode and a third junction between said first diode and said condenser, said second series circuit includes a fourth junction between said second resistor and said second negative resistance element, a fifth junction between said second negative resistance element and said second diode, said second resistor being connected to said third junction, said first and second coupling capacitors being connected to said second and fifth junctions respectively, said third coupling capacitor being connected between said first and fourth junctions.

5. An electronic bistable circuit as claimed in claim 2, wherein said first series circuit includes a first junction between said first resistor and said first diode, a second junction between said first diode and said first negative resistance element and a third junction between said first negative resistance element and said capacitor, said second series circuit includes a fourth junction between said second resistor and said second diode, and a fifth junction between said second diode and said second negative resistance element, said second resistor being connected to said third junction, said first and second coupling capacitors being connected to said second and fifth junctions respectively, and said third coupling capacitor being connected between said first and fourth junctions.

6. An electronic bistable circuit as claimed in claim 1, wherein said first and second negative resistance elements are semi-conductor type diodes.

7. An electronic bistable circuit as claimed in claim 6, wherein each of said semi-conductor type diodes comprises four semi-conductive layers of the N-P-N-P-type.

8. An electronic bistable circuit comprising in combination, an input terminal and at least one output terminal, a first series circuit including a first resistor, a first gas-filled discharge tube including a striking electrode, and a capacitor, a second series circuit including a second resistor and a second gas-filled discharge tube including a striking electrode, said second series connection shunting said capacitor, a direct voltage source connected to the ends of said first series circuit and having a voltage lower than the striking voltage of said first and second gas-filled discharge tubes, first and second coupling capacitors coupling said input terminal to said striking electrode of said first and second gas-filled discharge tubes respectively, said output terminal being connected to one of said first and second series circuits, and a third coupling capacitor coupling said first series circuit with said second series circuit to reduce the potential across one of said first and second gas-filled discharge tubes during firing of the other.

9. An electronic bistable circuit comprising in combination, an input terminal and at least one output terminal, a first series circuit including a first resistor, a first gas-filled discharge tube including a striking electrode, and a capacitor, a second series circuit including a second resistor and a second gas-filled discharge tube including a striking electrode, said second series connection shunting said capacitor, a direct voltage source connected to the ends of said first series circuit and having a voltage lower than the striking voltage of said first and second gas-filled discharge tubes, first and second coupling capacitors coupling said input terminal to said striking electrode of said first and second gas-filled discharge tube respectively, said output terminal being connected to one of said first and second series circuits, said first series circuit having a first junction between said first resistor and said first gas-filled discharge tube and a second junction between said first gas-filled discharge tube and said capacitor, and a third coupling capacitor connected between said first junction and the junction connecting said second resistor to said second gas-filled discharge tube, said second resistor being connected to said second junction.

References Cited by the Examiner

UNITED STATES PATENTS

| | | | |
|---|---|---|---|
| 2,483,691 | 10/1949 | Dawson | 328—67 |
| 2,596,142 | 5/1952 | Gerwin | 328—67 |
| 2,828,447 | 3/1958 | Mauchly | 315—84.5 |
| 2,944,164 | 7/1960 | Odell et al. | 307—88.5 |
| 2,980,863 | 4/1961 | Hussey | 307—88.5 X |
| 2,997,604 | 8/1961 | Shockley | 307—88.5 |
| 3,120,634 | 2/1964 | Genuit | 307—88.5 X |

ARTHUR GAUSS, *Primary Examiner.*

GEORGE N. WESTBY, JOHN W. HUCKERT, *Examiners.*